United States Patent [19]

Kanazawa et al.

[11] 4,210,827

[45] Jul. 1, 1980

[54] CONTROL CIRCUIT FOR GENERATING A STEP-TYPE CONTROL SIGNAL AND A CONTINUOUSLY VARYING CONTROL SIGNAL WHOSE AMPLITUDE CHARACTERISTIC REPEATS AT THE STEP TRANSITION

[75] Inventors: Kenichi Kanazawa, Atsugi; Yukio Tanaka, Yokohama, both of Japan

[73] Assignee: Sony Corporation, Tokyo, Japan

[21] Appl. No.: 932,618

[22] Filed: Aug. 10, 1978

[30] Foreign Application Priority Data

Aug. 11, 1977 [JP] Japan .................................. 52-96480

[51] Int. Cl.² ............................................. H03K 1/14
[52] U.S. Cl. .................................... 307/264; 307/290;
307/310; 307/359; 219/10.55 F; 219/486;
219/510
[58] Field of Search ................ 307/264, 290, 310, 358,
307/359; 328/70, 168, 172; 219/10.55 F, 486,
510; 236/47, 78 B

[56] References Cited

U.S. PATENT DOCUMENTS 3,118,601  1/1964  Robb, Jr. ........................ 307/290 X Primary Examiner—John Zazworsky
Attorney, Agent, or Firm—Lewis H. Eslinger; Alvin Sinderbrand

[57] ABSTRACT

A control circuit uses an adjustable resistance to generate a first control signal whose amplitude varies with the setting of the resistance and a second, step-like control signal whose level changes from a first to a second level at a predetermined setting of the resistance. The variable resistance is coupled to the collector of one of a pair of transistors whose emitters are commonly connected to a reference potential. The adjustable resistance's tap, which provides the first control signal, is connected to the base of the one transistor. A collector impedance and the variable resistance are coupled between the collector circuit of the one transistor and a voltage source. An output of the impedance is connected to the base of the other transistor, whose collector provides the second control signal. As the setting of the adjustable tap increases, the first control signal and the voltage at the base of the one transistor correspondingly increase from a first toward a second amplitude until the predetermined setting is reached. Then the relative conductivities of the transistors are reversed, and the first control signal reverts to its first amplitude, while the second control signal undergoes a step-like transition. Additional increases in the setting of the adjustable resistance again raise the first control signal from its first amplitude.

9 Claims, 26 Drawing Figures

POT. SETTING →

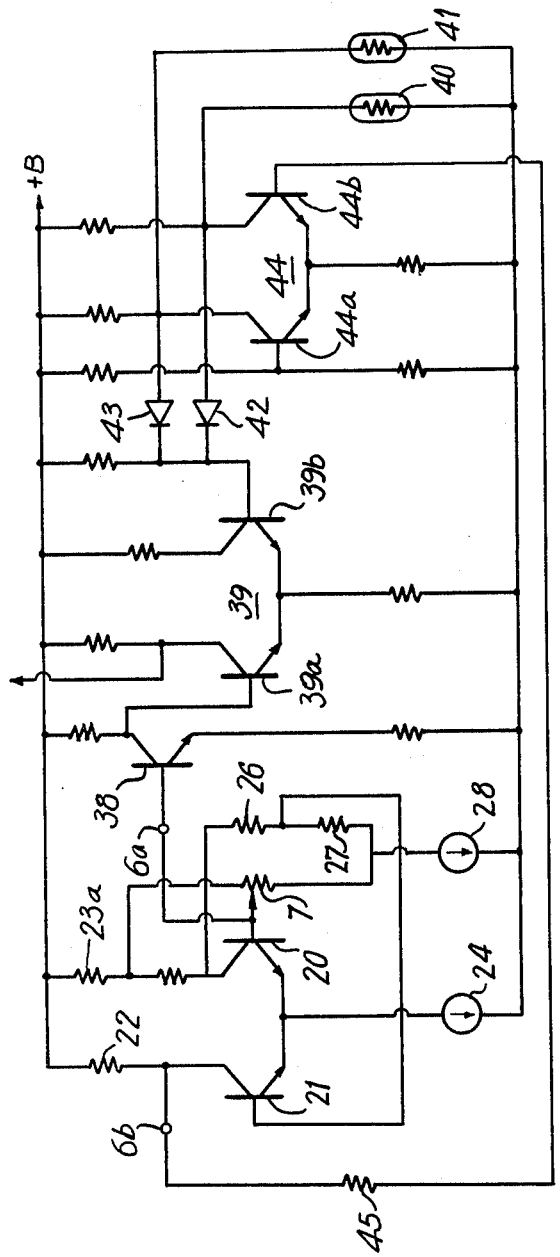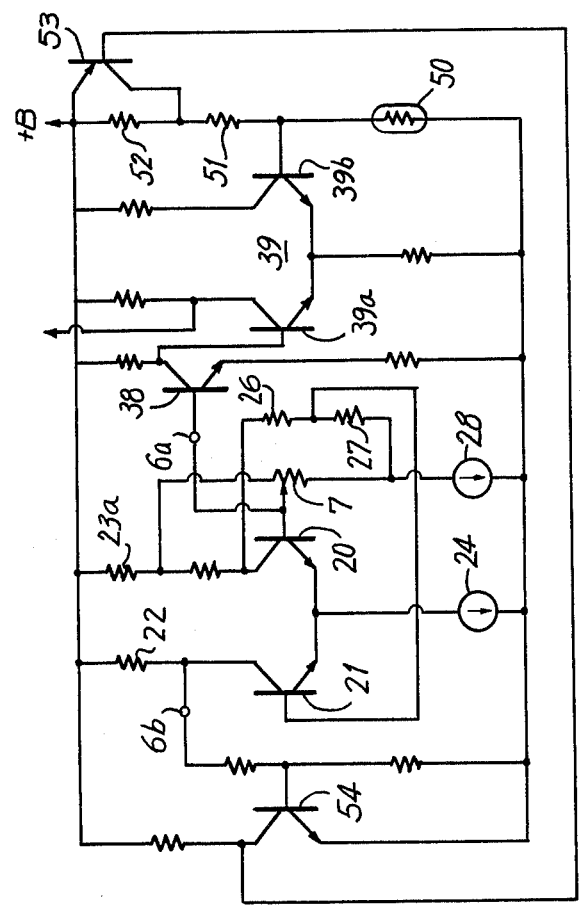
FIG. 8
FIG. 10 a control circuit for generating a step-type control signal and a continuously varying control signal whose amplitude characteristic repeats at the step transition

BACKGROUND OF THE INVENTION

This invention relates to a control signal generator of the type which is capable of generating two different types of control signals as a function of the setting of an adjustable resistance and, more particularly, to such a control signal generator wherein a first control signal has an amplitude which is a function of the setting of the resistance, and the second control signal has its level changed over from a first to a second level at a predetermined setting of the resistance.

Various applications are known for a control signal generator of the type described above. For example, in one use thereof, the control signal generator functions to control the operation of an induction heating device. Typically, an induction heating device includes an induction element, such as an induction coil, which is supplied with a rectified, filtered AC signal, and which is connected in series with a high frequency switch which operates to periodically interrupt the rectified current flowing through the coil. Such current interruptions result in an alternating flux of high frequency. If a conductive material is placed in this alternating flux, eddy currents are induced therein, and these currents generate heat. The frequency of the flux alternations is, of course, controlled by the switching frequency, and the amount of heat generated by the induction heating device is inversely related to this switching frequency. Thus, the amount of generated heat can be regulated by controlling the switching frequency of the switch.

Furthermore, in such an induction heating device, the rectified current which is supplied to the induction coil should be generated by a convertible rectifier, that is, a rectifier which is capable of operating either as a half-wave or as a full-wave rectifier. Of course, the magnitude of the rectified current which is produced by half-wave rectification is less than the magnitude of the current which is produced by full-wave rectification. Accordingly, the magnitude of the flux which is produced by the induction coil can be selected to be relatively low by operating the rectifier as a half-wave rectifier, thus generating a relatively low range of heat; or the flux can be selected to be relatively high by operating the rectifier as a full-wave rectifier, thus generating a relatively high range of heat.

In an induction heating device of the aforedescribed type, it is convenient to provide a single adjustable element, such as a potentiometer, for determining both the switching frequency of the switch and the half/full wave rectification mode of the rectifier. Thus, if the setting of the potentiometer increases from a minimum setting towards its maximum setting, a continuously varying control signal should be produced which is a function of the potentiometer setting. This control signal is used to control the switching frequency. Furthermore, when the potentiometer setting is within a relatively low range, another control signal should be produced for selecting the half-wave rectification mode of the rectifier. Then, when a predetermined setting of the potentiometer is reached, the frequency control signal should return abruptly to its initial level while, concurrently, the rectification control signal should change over so as to establish a full-wave rectification mode. Then, further increases in the setting of the potentiometer should result in a corresponding increase in the frequency control signal, whereby the heat generated by the induction coil now is increased over a second, higher range.

A control signal generator which generates a first, continuously variable, repeatable control signal as well as a step-wise control signal also is useful in controlling the operation of either one of two different devices in response to the setting of a single adjustable element. When the setting of the adjustable element is within a first range, the level of the step-wise control signal is such that one of the devices is selected to be controlled as a function of the continuously varying control signal. Then, when the setting of the adjustable element reaches the second range, the level of the step-wise control signal changes so that the second device is selected to be controlled. At the same time, the continuously varying control signal returns to an initial amplitude thereof to obtain proper control over this second device.

Yet another application of a control signal generator of the aforedescribed type is to control a single device over two separate ranges as a function of the setting of a single adjustable element. In such an environment, when the step-wise control signal is at one level, the gain of the overall control system which is used with the control signal generator is set at, for example, a lower level, whereby the operation of the device is controlled as a function of the continuously varying control signal. Then, when the level of the step-wise control signal changes, the overall gain of the control system also changes, for example, to a higher level, and the device now is controlled over a higher operating range as a function of the continuously varying control signal.

OBJECTS OF THE INVENTION

Therefore, it is an object of the present invention to provide an improved control circuit which is adapted to generate a first control signal of continuously increasing or decreasing amplitude as a function of the setting of an adjustable element, and a second step-wise control signal, wherein the first control signal changes from, for example, a high amplitude to a low amplitude when the setting of the adjustable element is increased to a predetermined setting, while the step-wise control signal undergoes a step transition; or wherein the first control signal changes from a low amplitude to a high amplitude when the setting of the adjustable element is reduced to a predetermined setting, while the step-wise control signal concurrently undergoes a step transition.

Another object of this invention is to provide an improved control circuit of the type described, which circuit is of relatively simple and inexpensive construction.

A still further object of this invention is to provide a control circuit of the type described wherein the continuously varying control signal and the step-wise control signal both are produced as a function of the setting of a single adjustable element.

Another object of this invention is to provide a control circuit of the type described which is advantageously used with an induction heating device.

A further object of the present invention is to provide a control circuit of the type described which can be advantageously utilized to selectively control the operation of plural operating devices.

Yet another object of this invention is to provide a control circuit of the type described which finds ready application for controlling the operation of a device over two separate operating ranges.

Various other objects, advantages and features of the present invention will become readily apparent from the ensuing detailed description, and the novel features will be particularly pointed out in the appended claims.

SUMMARY OF THE INVENTION

In accordance with this invention, a control circuit is provided for use with an adjustable resistance so as to generate a first control signal whose amplitude is a function of the setting of the resistance and to generate a second control signal whose level is changed over from a first to a second level at a predetermined setting of the resistance. The control circuit includes a pair of transistors whose emitter electrodes are connected in common to a reference potential. The adjustable resistance is coupled to the collector circuit of one of the transistors and includes an adjustable output tap which is coupled to the base electrode of that transistor. The first control signal is derived from this adjustable output tap. An impedance is coupled to the collector electrode of the one transistor, and a current source is connected in common to the adjustable resistance and to the impedance such that both the adjustable resistance and the impedance are coupled between the collector circuit of the one transistor and the current source. An output of the impedance is coupled to the base electrode of the other transistor, and the second control signal is derived from the collector electrode of that other transistor, whereby as the setting of the adjustable output tap changes, the voltage applied to the base electrode of the one transistor, as well as the first control signal, correspondingly changes from a first amplitude toward a second amplitude until the predetermined setting is reached, whereupon the relative conductivities of the transistors is reversed and the first control signal changes back to its first amplitude. As the setting of the adjustable output tap is further changed, the amplitude of the first control signal changes once again from its first amplitude toward its second amplitude.

One application of the control circuit which is disclosed herein is to control the operation of an induction heating device. Another application of this control circuit is to selectively control either of two devices. Yet a further application of this control circuit is to control the operation of a single device over different operational ranges.

BRIEF DESCRIPTION OF THE DRAWINGS

The following detailed description, given by way of example, will best be understood in conjunction with the accompanying drawings in which:

FIG. 8 is a schematic diagram of one application of the present invention;

FIG. 10 is a schematic diagram of another application of the present invention.

DETAILED DESCRIPTION OF SOME PREFERRED EMBODIMENTS

Figures 1, 2, 3A, 3B, 3C, 3D, 3E:
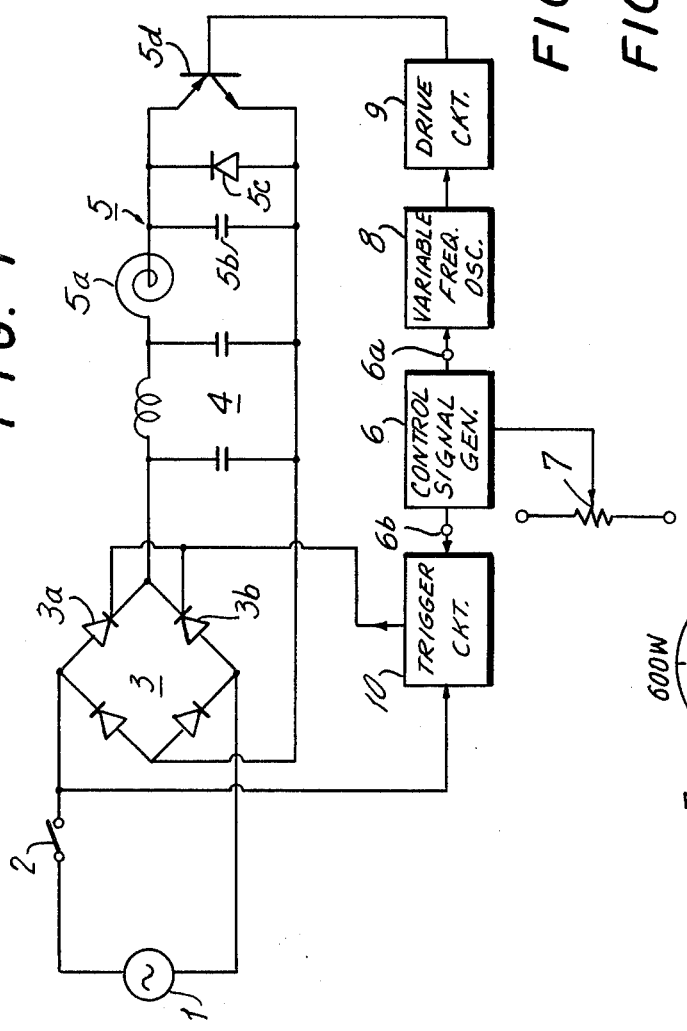
FIG. 1 is a partial block, partial schematic diagram of an induction heating device with which the present invention can be used.
FIG. 2 is a simplified diagram of the control knob of an adjustable element which can be used with this invention.
FIGS. 3A–3E are waveform diagrams which are useful in understanding the operation of the apparatus shown in FIG. 1.

Before discussing the present invention in detail, one application with which it can be used advantageously is shown in the partial block, partial schematic diagram of FIG. 1. The apparatus represented in this diagram is an induction heating device and includes an induction element, or coil 5a which is controlled to generate an alternating flux whose magnitude and frequency determines the amount of heat which is generated by the induction coil. As is known, in an induction heating device, if a conductive material is placed in the alternating flux, eddy currents are induced therein. These eddy currents generate heat which, in turn, can be used to heat or cook a desired object. Control over the amount of generated heat is achieved by controlling the frequency at which the flux alternates and the magnitude of that flux.

The illustrated induction coil is adapted to be supplied with a DC current supplied thereto by a rectifier 3 and a filter 4. A switching device 5d, such as a gate controlled switch (GCS) is connected in series with induction coil 5a so as to periodically interrupt the DC current therethrough, whereby the induction coil generates the alternating flux.

GCS 5d is controlled by a drive signal supplied thereto by a drive circuit 9 which, in turn, receives a relatively high frequency oscillating signal from a controllable oscillator 8. The output electrodes of GCS 5d are connected in series with induction coil 5a.

Rectifier 3 preferably is a bridge rectifier coupled to an AC supply source 1, such as AC mains, by an ON/OFF power switch 2. The bridge rectifier includes a pair of output terminals which are connected in series with induction coil 5a and GCS 5d. Thus, rectifier 3 supplies rectified AC signals to the induction coil. In addition, filter circuit 4 is interposed between rectifier 3 and induction coil 5a for the purpose of filtering or smoothing the rectified signal produced by the rectifier. In this manner, the combination of rectifier 3 and filter 4 supply induction coil 5a with DC power. The operation of GCS 5d functions to periodically interrupt the direct current which is supplied to the induction coil.

Rectifier 3 includes a pair of switchable rectifiers 3a and 3b, such as thyristors, which are selectively triggered into conduction. A first current path, such as may be adapted to conduct the positive half cycle of the AC waveform, includes switchable rectifier 3a. If this rectifier is triggered into conduction, the positive half cycle is rectified thereby and supplied to induction coil 5a. A second current path, such as may conduct the negative half cycle of the AC waveform, includes switchable rectifier 3b. When this rectifier is triggered into conduction, the negative half cycle is supplied to induction coil 5a. A trigger circuit 10 is connected to the control terminals, such as the gate electrodes, of thyristors 3a and 3b and is adapted to trigger a selected one or both of these thyristors into conduction. As may be appreciated, if only one thyristor is triggered into conduction, then rectifier 3 functions as a half-wave rectifier. On the other hand, if trigger circuit 10 operates to trigger both thyristors into conduction, then the rectifier operates as a full-wave rectifier. Of course, and as mentioned above, a higher rectified DC current is supplied to induction coil 5a and to GCS 5d when rectifier 3 operates as a full-wave rectifier than when half-wave rectification is selected. As an example thereof, trigger circuit 10 may be of the type described in copending application Ser. No. 931,765.

The amount of heat generated by induction coil 5a is selected in accordance with a manual adjustment of a controlling element, such as a settable potentiometer 7. That is, depending upon the setting of this potentiometer, a corresponding amount of heat is generated by the induction coil. An adjustment to potentiometer 7 results in a corresponding adjustment in the amount of generated heat. To this effect, a control circuit 6 is coupled to the adjustable output tap, or equivalent, of potentiometer 7, and is adapted to produce control signals at its output terminals 6a and 6b as a function of the setting of the potentiometer. As illustrated in FIG. 1, control circuit 6 is coupled to oscillator 8 so as to supply a frequency-determining signal, such as a frequency-determining voltage, to the oscillator. Control circuit 6 also is coupled to trigger circuit 10 so as to supply a step-wise control signal to the trigger circuit, the level, or state of this step-wise control signal serving to establish whether the trigger circuit triggers one or both of the thyristors into conduction. Thus, depending upon the state of this step-wise control signal, rectifier 3 is controlled to operate either as a half-wave or as a full-wave rectifier, thus determining the level of the DC current supplied to induction coil 5a. The combined result of controlling oscillator 8 and controlling trigger circuit 10 achieves a corresponding control over the heat generated by induction coil 5a.

A capacitor 5b and a diode 5c are connected in parallel across the output terminals of GCS 5d. Capacitor 5b in combination with inductance coil 5a forms a resonant circuit. Diode 5c functions as a damper diode. When GCS 1 is turned ON by the high frequency drive signals supplied thereto, current flows from rectifier 3 through filter 4 to inductance coil 5a and through GCS 5d back to the rectifier. When the GCS is turned OFF in response to the high frequency drive signals supplied thereto, a half cycle of a resonant current flows through inductance coil 5a and capacitor 5b. Damper diode 5c damps this resonant current after the first half cycle thereof. Thus, it may be appreciated that the inductance coil, GCS, capacitor and diode operate in a manner analogous to the operation of a conventional horizontal deflection circuit in a cathode ray tube.

FIG. 2 represents a simplified diagram of a control knob 7a which can be used with potentiometer 7. Control knob 7a is calibrated in terms of watts over a first range extending from 300 W to 600 W, and over a second range extending from 600 W to 1200 W. The setting of potentiometer 7 corresponds to an analogous setting of control knob 7a at some location over the first range (300 W–600 W) or at some location over the second range (600 W–1200 W). As will be explained, if the setting of knob 7a increases from 300 W towards 600 W, the control voltage produced at output terminal 6a of control signal generator 6 and supplied to controllable oscillator 8 correspondingly increases in a substantially continuous manner. As this control signal increases, the frequency of the oscillating signal produced by oscillator 8 changes in a manner so as to change the frequency of the drive signals supplied to GCS 5d, thereby increasing the heat generated by induction coil 5a. At the same time, the step-wise control signal which is produced at output terminal 6b of control signal generator 6 is at a level whereby trigger circuit 10 controls rectifier 3 to operate in its half-wave rectification mode.

When knob 7a is set at 600 W, the control voltage applied to controllable oscillator 8 abruptly returns to its lower amplitude, whereby the frequency of the oscillating signal produced by oscillator 8 likewise returns abruptly to its initial frequency. Also, the stepwise control signal supplied to trigger circuit 10 now undergoes a transition, whereby the trigger circuit controls rectifier 3 to operate in its full-wave rectification mode. Therefore, although the heat generated by induction coil 5a as a function of the switching frequency of GCS 5d now is reduced, the heat generated thereby as a function of the rectifier current supplied thereto is increased. Thus, when control knob 7a is set at the 600 W setting, a break-over point in the heat characteristic of the induction coil is reached.

The foregoing description is best appreciated by referring to the waveform diagrams shown in FIGS. 3A–3E. FIG. 3A represents an increase in the voltage supplied to controllable oscillator 8 by control signal generator 6 as the setting of potentiometer 7 increases. That is, as the setting of knob 7a increases from 300 W to 600 W, the voltage shown in FIG. 3A increases from a reference level towards a higher level. FIG. 3B represents that the frequency of the oscillating signal produced by oscillator 8 in response to the control voltage supplied thereto (FIG. 3A) decreases as this control voltage increases. Consequently, the frequency of the drive signal supplied to GCS 5d decreases from a higher frequency, for example 28 KHz, toward a lower frequency. As the frequency of the drive signals decreases, the frequency of the flux generated by induction coil 5a likewise decreases so as to increase the amount of heat induced thereby. As shown in FIG. 3C, the step-wise control signal supplied to trigger circuit 10 by control signal generator 6 is at its relatively lower level while the setting of potentiometer 7 increases from 300 W to 600 W. Thus, rectifier 3 operates as a half-wave rectifier to supply a rectified current having the waveform shown in FIG. 3D. Therefore, the combination of the drive signals supplied to GCS 5d and having the frequency characteristic shown in FIG. 3B, and the half-wave rectified current having the characteristic shown in FIG. 3D results in a heating characteristic as shown in FIG. 3E from the 300 W level to the 600 W level.

When control knob 7a is set at the 600 W level, the control voltage supplied to oscillator 8 abruptly returns from its higher amplitude to its initial, lower amplitude, as shown in FIG. 3A. This, of course, increases the frequency of the drive signals which are supplied to GCS 5d, as shown by the abrupt increase in FIG. 3B. At the same time, the step-wise control signal supplied to trigger circuit 10 by control signal generator 6 undergoes a positive transition from its lower level to its higher level, as shown in FIG. 3C. This means that trigger circuit 10 controls rectifier 3 to operate in its full-wave rectification mode, as illustrated in FIG. 3D. A subsequent increase in the setting of control knob 7a increases the voltage supplied to oscillator 8 and, therefore, decreases the frequency of the drive signals supplied to GCS 5d. Hence, the amount of heat generated by induction coil 5a when control knob 7a is adjusted from the 600W level to the 1200 W level is shown in FIG. 3E. It is seen that the slope of this characteristic from the 600–1200 W level is greater than the slope of this characteristic from the 300–600 W level. This is because, although the change in the frequency of the drive signals supplied to the GCS is the same over both operating ranges, that is, over the range 300 W–600 W, and over the range of 600 W–1200 W, the amount of current supplied to induction coil 5a over the higher range is greater than the amount of current which is supplied thereto over the lower range.

It is advantageous to control the heat, or power, derived from induction coil 5a by a combination of current control and frequency control rather than merely frequency control. It may be appreciated that, in order to vary the generated heat from the 300 W level to the 1200 W level, it would be necessary to provide a much greater frequency range over which the frequency of the drive signal supplied to GCS 5d changes. This means that oscillator 8 and drive circuit 9 would be of far more complicated, and expensive, construction. Also, GCS 5d would be relatively expensive in order to operate properly over such a broad frequency range. Furthermore, the frequencies of the noise radiated from induction coil 5a would extend over this relatively large frequency range. By controlling the heat generated by induction coil 5a as a function of the direct current supplied by rectifier 3, the frequency range over which the GCS drive signal must vary can be confined to a much smaller range. This avoids the aforenoted problems. Furthermore, by regulating the generated heat as a function of the switching frequency of GCS 5d, precise heating control is attained.

Figure 4:
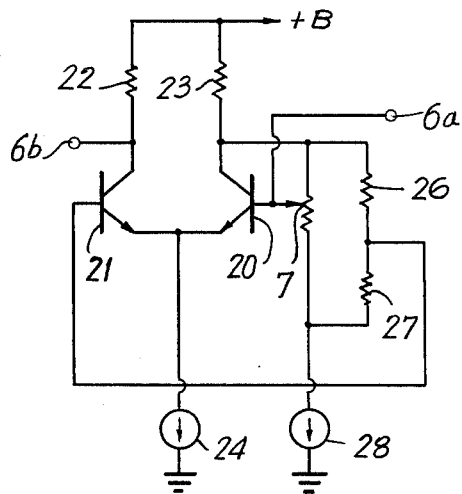
FIG. 4 is a schematic diagram of one embodiment of the present invention.

Turning now to FIG. 4, there is illustrated a schematic diagram of one embodiment of control signal generator 6. This embodiment includes a pair of transistors 20 and 21 whose emitter electrodes are connected in common to a reference potential, such as ground, by a constant current source 24. The collector electrodes of transistors 20 and 21 are coupled to a source of operating potential +B by collector load resistors 23 and 22, respectively. The collector electrode of transistor 20 additionally is connected to a parallel circuit having one branch which contains potentiometer 7 and another branch which contains series-connected resistors 26 and 27. This parallel circuit is coupled to ground by another constant current source 28. The adjustable output tap, or wiper, of potentiometer 7 is connected to the base electrode transistor 20. The junction defined by series-connected resistors 26 and 27 is connected to the base electrode of transistor 21. Output terminal 6a is coupled to the wiper of potentiometer 7; and output terminal 6b is coupled to the collector electrode of transistor 21.

Preferably, the resistance values of resistors 26 and 27 are equal so that the ratio therebetween is 1:1. Accordingly, if it is assumed that the output tap of potentiometer 7 is set at a relatively low setting, the voltage supplied therefrom to the base electrode of transistor 20 is less than the voltage which is supplied from the output of voltage divider resistors 26 and 27. Consequently, transistor 21 is conductive and transistor 20 is non-conductive. This means that the step-wise control signal produced at output terminal 6b is at its relatively low level, as shown in FIG. 3C. As the setting of the output tap of potentiometer 7 increases, the control voltage supplied to output terminal 6a likewise increases. As one example, this control voltage may increase proportionally with the increase in the setting of the potentiometer, as shown in FIG. 3A.

When the setting of potentiometer 7 reaches a predetermined setting, for example, if this setting corresponds to the 600 W calibration shown in FIG. 2, then the voltage produced at the output tap of potentiometer 7 exceeds the voltage which is produced at the output of voltage divider resistors 26 and 27. Accordingly, transistor 21 now becomes non-conductive, and transistor 20 becomes conductive. Consequently, the step-wise control signal produced at output terminal 6b undergoes a positive transition to its relatively higher level, as shown in FIG. 3C. Also, the voltage at the collector electrode of transistor 20 is substantially reduced when this transistor becomes conductive. Thus, the voltage across potentiometer 7, and also the voltage across the series-connected voltage divider resistors 26 and 27 is correspondingly reduced. It may be appreciated that the voltage drop across collector load resistor 23 is large because the current which flows through this resistor is a combination of the constant current established by constant current source 28 and the collector-emitter current of transistor 20. Since this voltage across the collector load resistor increases, the voltage across potentiometer 7 must decrease. Consequently, even though the setting of the output tap of the potentiometer is not further adjusted, since the voltage across the potentiometer is reduced, it is seen that the voltage produced at its output tap likewise is reduced. Thus, an abrupt reduction in the control voltage produced at output terminal 6a occurs, as shown in FIG. 3A. More particularly, when the predetermined setting of the potentiometer is reached, the amplitude of the control voltage produced at output terminal 6a returns abruptly to its initial amplitude. Then, a further increase in the setting of the potentiometer produces a corresponding increase in the voltage at its output tap and, thus, a corresponding increase in the control signal which is produced at output terminal 6a. As seen in FIG. 3A, the control signal which is produced at output terminal 6a increases as a function of the setting of potentiometer 7; and this voltage characteristic over the lower range of the potentiometer setting is repeated over the higher range once the potentiometer reaches a predetermined setting (e.g. 600 W).

The relationship between the increase in the voltage of the control signal produced at output terminal 6a as the setting of potentiometer 7 increases is the same for potentiometer settings over the lower range as for potentiometer settings over the higher range. Since the voltage drop across the parallel circuit formed of potentiometer 7 and voltage divider resistors 26 and 27 is determined by constant current source 28, then a proper selection of the resistance of resistor 23 and the current established by constant current source 24 will result in substantially equal voltage/setting characteristics for the control signal produced at output terminal 6a when the setting of potentiometer 7 is in the low and higher ranges, respectively.

Figure 5:
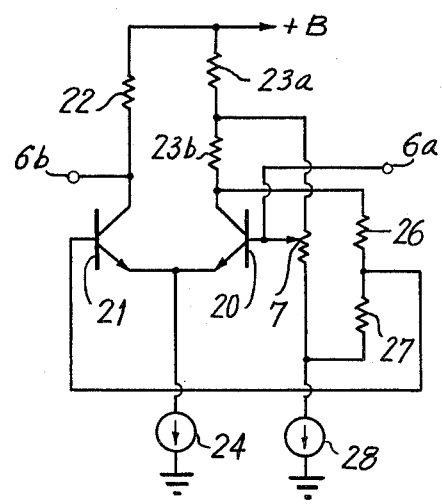
FIG. 5 is a schematic diagram of another embodiment of the present invention.

Another embodiment of a control circuit in accordance with the present invention wherein a control signal of the type shown in FIG. 3A and a step-wise control signal of the type shown in FIG. 3C are generated is illustrated schematically in FIG. 5. Those elements shown in this embodiment which are identical or substantially similar to corresponding elements which have been shown and described with respect to the embodiment of FIG. 4 are identified by the same reference numerals. It is seen that the difference between the embodiment shown in FIG. 5 and the afore-described embodiment is that collector load resistor 23 is formed of a pair of series-connected resistors 23a and 23b. Furthermore, potentiometer 7 no longer is connected in parallel with voltage divider resistors 26 and 27. Rather, the voltage divider resistors are connected directly to the collector electrode of transistor 20, and potentiometer 7 is connected to the collector circuit of this transistor and, more particularly, is connected through resistor 23b to the collector electrode of transistor 20. All other connections remain the same as in the previously described embodiment.

By providing series resistors as the collector load resistor for transistor 20, and by connecting potentiometer 7 to the junction defined by these series resistors, the embodiment shown in FIG. 5 is provided with hysteresis so as to exhibit a so-called "Schmitt" effect. In operation, transistor 21 is conductive and transistor 20 is non-conductive when the setting of the output tap of potentiometer 7 produces a lower voltage thereat than the voltage produced at the output of voltage divider resistors 26 and 27. This, of course, is similar to the operation described previously. Also, when the voltage produced at the output tap of the potentiometer exceeds the output voltage derived from the voltage divider resistors, transistor 21 becomes non-conductive and transistor 20 becomes conductive. When transistor 20 conducts, the collector-emitter current flowing therethrough also flows through resistors 23a and 23b. Consequently, a substantial voltage drop is produced across resistor 23b. Thus, the voltage across voltage divider resistors 26 and 27, that is, the collector voltage of transistor 20, is far less than the voltage across potentiometer 7. Thus, the predetermined setting of potentiometer 7 which was effective to reverse the conductivities of transistors 20 and 21 when the potentiometer setting was increasing will not be effective to reverse these conductivities once again when the potentiometer setting is reduced. Rather, the output tap of potentiometer 7 must be set to a lower setting in order to supply the base electrode of transistor 20 with a voltage which is less than the voltage supplied to the base electrode of transistor 21 by the output of voltage divider resistors 26 and 27. Thus, it is seen that, because of the hysteresis introduced by resistor 23b, the step-wise control signal produced at output terminal 6b (shown in FIG. 3C) will undergo a positive transition at a higher potentiometer setting than the setting which is effective to cause this step-wise control signal to undergo a negative transition. Also, because of this hysteresis, the voltage of the control signal produced at output terminal 6a will abruptly return from its relatively higher level to an initial level when the setting of the potentiometer is increased to the predetermined setting. However, when the setting of the potentiometer is reduced toward its predetermined setting, the voltage of the control signal produced at output terminal 6a will be decreased below its initial amplitude before rising abruptly to its higher level.

Figure 6A:
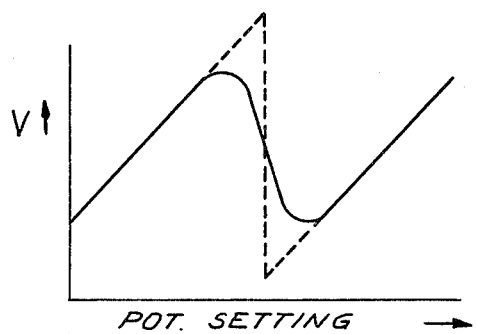
FIGS. 6A–6C are waveform diagrams which are useful in explaining the operation of the embodiments shown in FIGS. 4 and 5.
Figure 6B:
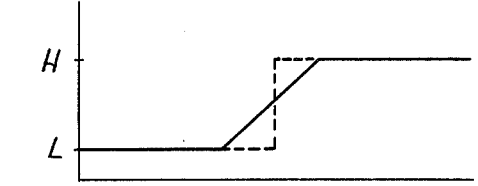
Figure 6C:
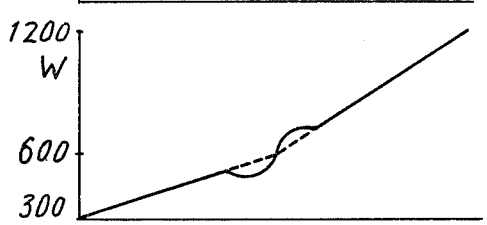

A comparison of the respective control signals which are produced by the embodiments shown in FIGS. 4 and 5 is represented by the waveforms of FIGS. 6A and 6B. FIG. 6A represents the control signal which is produced at output terminal 6a, and which is referred to herein as the continuously varying control signal, because the amplitude thereof varies continuously as a function of the setting of potentiometer 7. FIG. 6B represents the step-wise control signal produced at output terminal 6b. In both figures, the waveforms shown in solid lines are produced by the embodiment shown in FIG. 4, and the waveforms shown in broken lines are produced by the embodiment shown in FIG. 5. It may be appreciated that when the predetermined setting of the output tap of potentiometer 7 is reached in the embodiment of FIG. 4, a finite time is needed for the control signal produced at output terminal 6a to return from its higher amplitude to its initial, lower amplitude. In the embodiment of FIG. 5, this change-over is performed more rapidly. Also, and because of the hysteresis introduced in the embodiment of FIG. 5, when the setting of the output tap of potentiometer 7 is reduced from its higher range toward its lower range, the amplitude of the control signal produced at output terminal 6a is reduced below its initial amplitude, and then an abrupt change-over occurs. Furthermore, the transition in the step-wise control signal produced at output terminal 6b occurs more rapidly for the embodiment of FIG. 5 than for the embodiment of FIG. 4, as represented by the waveforms shown in FIG. 6B. When the continuously-varying and step-wise control signals shown in FIGS. 6A and 6B are used to control the switching frequency of GCS 5d and the rectification mode of rectifier 3 of the induction heating device shown in FIG. 1, the relationship between the heat (or power) generated by induction coil 5a and the setting of potentiometer 7 is as shown by the waveforms of FIG. 6C. Here again, the waveform illustrated by the solid line is derived from the embodiment of FIG. 4; and the waveform illustrated by the broken line is derived from the embodiment of FIG. 5. It is seen that, when the embodiment of FIG. 5 is used, there is a smooth break-point between the lower and higher power ranges. However, when the embodiment of FIG. 4 is used, an undesired fluctuation occurs at the higher portion of the lower power range and at the lower portion of the higher power range. Thus, a smooth break-point between these ranges is not attained. Rather, undesired fluctuations are present when the output tap of potentiometer 7 is within the vicinity of its predetermined setting when the control circuit shown in FIG. 4 is used. Therefore, as may be recognized, the embodiment of FIG. 5 is an improvement, and thus is preferred, over the embodiment of FIG. 4. By reason of the hysteresis characteristic which is introduced into the embodiment of FIG. 5, once rectifier 3 is changed over, for example, half-wave rectification to full-wave rectification, an undesired reversal in the operation of the rectifier is avoided even if the setting of potentiometer 7 is slightly, or inadvertently, reduced. Consequently, spurious noise which may be present in the induction heating device will not erroneously change the operation of rectifier 3.

Figure 7A:
FIGS. 7A–7J are waveform diagrams representing the types of control signals which can be generated by the control circuit of the present invention.
Figure 7B:
Figure 7C:
Figure 7D:
Figure 7E:
Figure 7F:
Figure 7G:
Figure 7H:
Figure 7I:
Figure 7J:

In the embodiments of FIGS. 4 and 5, it is assumed that the resistance values of voltage divider resistors 26 and 27 are equal. Depending upon the ratio of these resistance values, the predetermined setting of potentiometer 7 which reverses the conductivities of transistors 20 and 21 will be determined accordingly. Furthermore, it has been assumed that the change in the amplitude of the control signal produced at output terminal 6a is linearly related to the setting of potentiometer 7. A non-linear relationship may exist, if desired. Referring to FIGS. 7A and 7B, the waveforms of the continuously-varying control signal at output terminal 6a and the step-wise control signal at output terminal 6b, respectively, are illustrated for the assumption of equal resistance values for resistors 26 and 27. The waveforms shown in FIGS. 7C and 7D represent the continuously-varying and step-wise control signals, respectively, when the resistance of resistor 26 is larger than the resistance of resistor 27. The waveforms shown in FIGS. 7E and 7F represent the continuously-varying and step-wise control signals, respectively, when the resistance of resistor 27 is larger than the resistance of resistor 26. FIGS. 7G and 7H represent the waveforms of the continuously-varying and step-wise control signals when the voltage produced at the output tap of potentiometer 7 varies in a non-linear manner with respect to the setting thereof. The waveforms shown in FIGS. 7I and 7J represent the continuously-varying and step-wise control signals when another non-linear relationship exists between the voltage produced at the output tap of potentiometer 7 and the setting thereof.

The foregoing has described the use of the control circuit of the present invention in the environment of an induction heating device. Various other applications of this invention are contemplated wherein a continuously-varying control signal and a step-wise control signal are needed. For example, and with reference to FIG. 8, this invention can be used in a control system for selectively controlling the operation of either of two different devices. Although the operation can be of any desired nature, let it be assumed that the control system is used to selectively heat either of two different devices to a desired temperature. As schematically shown in FIG. 8, this control system includes the control circuit of the type described previously with respect to FIG. 5, a comparator 39, a switch 44 and sensors 40 and 41. Comparator 39 is a differential amplifier including differentially-connected transistors 39a and 39b. The base electrode of transistor 39a is coupled to output terminal 6a of the control circuit via an inverting transistor 38. Thus, if the continuously-varying control signal which is produced at output terminal 6a is assumed to be a reference control signal, this reference control signal is a phase-inverted and supplied to comparator 39. The base electrode of transistor 39b is selectively coupled to sensors 40 and 41 through switch 44.

Sensors 40 and 41 are adapted to sense the actual operation of the devices which are controlled by the illustrated control system. Consistent with the assumption that the illustrated control system is used to control a heating operation, sensors 40 and 41 are heat sensors, such as thermistors, whose resistance varies inversely with the temperature of the device being heated. Thermistor 40 is coupled via a switching diode 42 to the base electrode of transistor 39b, and thermistor 41 is coupled via a switching diode 43 to the base electrode of this transistor. Thus, depending upon which of the switching diodes is conductive, either thermistor 40 or thermistor 41 is connected to transistor 39b. Switch 44, which is comprised of differentially-connected transistors 44a and 44b, determines which of switching diodes 42 and 43 is conductive. The base electrode of transistor 44a is supplied with a substantially constant bias voltage derived by voltage divider resistors which are connected across a suitable source of operating potential +B. The base electrode of transistor 44b is coupled by a resistor 45 to output terminal 6b for receiving the step-wise control signal.

The operation of the control system shown in FIG. 8, used to control a heating operation, now will be described. Let it be assumed that the voltage provided at the collector electrode of transistor 39a of comparator 39 is a control voltage which is selectively connected either to heating apparatus which is used to heat the device associated with sensor 40 or to heating apparatus which is used to heat the device associated with sensor 41. A switching circuit (not shown) controlled by the step-wise control signal produced at output terminal 6b selectively supplies this control voltage to one or the other heating apparatus. Let it be further assumed that potentiometer 7 is provided with a control knob of the type shown in FIG. 9. This control knob is calibrated over a first range from, for example, 60° C. to 100° C., and over a second range, also from 60° C. to 100° C. These separate ranges are depicted by the shaded area of the schematic representation. A predetermined position A separates these two ranges. Furthermore, as the setting of the control knob is changed in a single direction, it is appreciated that the setting of the output tap of potentiometer 7 likewise is changed in the same direction.

When control knob 7a is adjusted in the unshaded range between 60° C. and 100° C., the voltage supplied to the base electrode of transistor 20 by the output tap of potentiometer 7 is less than the voltage which is supplied to the base electrode of transistor 21 from the output of voltage divider resistors 26 and 27. Thus, transistor 21 is conductive and transistor 20 is non-conductive. Accordingly, the step-wise control signal produced at output terminal 6b is at its relatively lower level, and this lower level voltage is supplied to the base electrode of transistor 44b. Consequently, transistor 44a is conductive and transistor 44b is non-conductive. This means that the voltage produced at the collector electrode of transistor 44b is at a relatively higher level, and the voltage produced at the collector electrode of transistor 44a is at a relatively lower level. Therefore, diode 42 is conductive so as to connect thermistor 40 to the base electrode of transistor 39b.

Depending upon the setting of the output tap of potentiometer 7, a corresponding control signal amplitude is produced at output terminal 6a. The phase of this control signal is inverted and supplied to the base electrode of transistor 39a. Thus, comparator 39 functions to compare the reference control signal, which is supplied to the base electrode of transistor 39a, to the sensor signal, which is supplied to the base electrode of transistor 39b. It is appreciated that the sensor signal is a function of the resistance of thermistor 40. If the temperature of the device under control is less than the temperature selected by the reference control signal, then the base voltage at transistor 39a is less than the base voltage at transistor 39b. Consequently, a relatively higher control voltage is produced at the collector electrode of transistor 39a, and this control voltage is supplied to the heating apparatus which heats the device associated with thermistor 40. As the temperature of this device increases, the resistance of thermistor 40 decreases. Finally, the resistance of thermistor 40 will be reduced sufficiently such that the base voltage at transistor 39a exceeds the base voltage at transistor 39b. Consequently, the control voltage which is produced at the collector electrode of transistor 39a becomes sufficiently low so as to reduce, or interrupt, the operation of the heating apparatus. Of course, as the temperature of the device being heated decreases, the resistance of thermistor 40 increases so as to increase the base voltage of transistor 39b, and thus increase the control voltage produced at the collector electrode of transistor 39a. In this manner, the device associated with thermistor 40 is properly heated to the level selected by the setting of potentiometer 7.

Let it now be assumed that the device associated with thermistor 41 is to be controlled. Accordingly, knob 7a is adjusted within the range designated by the shaded area shown in FIG. 9. During this adjustment, when the knob reaches position A, the voltage supplied to the base electrode of transistor 20 by the output tap of potentiometer 7 exceeds the voltage applied to transistor 21 by the output of voltage divider resistors 26 and 27. Thus, and is recognized, transistor 21 becomes non-conductive and transistor 20 becomes conductive. Consequently, the step-wise control signal produced at output terminal 6b undergoes a positive transition. At the same time, since transistor 20 now becomes conductive, the voltage across potentiometer 7 is reduced, whereby the voltage produced at the output tap thereof, and supplied to output terminal 6a, likewise is reduced abruptly to an initial amplitude corresponding to a temperature setting of 60° C.

The positive transition in the step-wise control signal produced at output terminal 6b results in a base voltage at transistor 44b which exceeds the base voltage at transistor 44a. Therefore, transistor 44a becomes non-conductive so as to forward bias switching diode 43, while transistor 44b becomes conductive to render diode 42 non-conductive. This means that diode 43 now connects thermistor 41 to comparator 39.

As before, the reference control signal supplied to comparator 39 from output terminal 6a is a function of the setting of potentiometer 7. The comparator now compares this reference control voltage to the voltage which is derived from thermistor 41. In this manner, the actual temperature of the device associated with thermistor 41 is compared to the desired temperature setting therefor, and any difference therebetween is used to control the heating of the device. As the setting of control knob 7a is adjusted in the shaded range shown in FIG. 9, the heating of the controlled device is correspondingly adjusted, as described previously with respect to the control over the device associated with thermistor 40.

Figure 9:
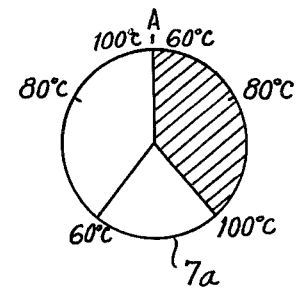
FIG. 9 is a simplified diagram of a control knob which can be used to control the operation of the apparatus shown in FIG. 8.

As may be appreciated, if knob 7a now is set back to the unshaded range shown in FIG. 9, the conductivities of transistors 20 and 21 again are reversed so that the step-wise control signal now undergoes a negative transition. This returns transistor 44a to its conductive condition and transistor 44b to its non-conductive condition. Hence, diode 42 is forward biased to connect thermistor 40 to comparator 39. Depending upon the particular setting of control knob 7a, the heating apparatus is controlled in response to the control voltage supplied thereto from the collector electrode of transistor 39a to heat the device associated with thermistor 40 to the temperature selected by potentiometer 7. Although not shown herein, it should be understood that the heating apparatus to which the collector electrode of transistor 39a is selectively coupled may include, for example, a power supply switch which is selectively closed or opened, depending upon the error voltage produced by comparator 39. Of course, if the illustrated control system is incorporated into a different environment, the control voltage produced at the collector electrode of transistor 39a is supplied to any suitable drive apparatus.

Another application of the control circuit in accordance with the present invention is to selectively control a single device over two different operating ranges. A control system in accordance with such an application is illustrated in FIG. 10. In this system, the control circuit is of the type described previously with respect to the embodiment of FIG. 5, and output terminal 6a thereof is connected to one input of comparator 39 through an inverting transistor 38. Comparator 39 is seen to be substantially similar to the comparator described in FIG. 8.

A sensor 50, adapted to produce an output signal representing the actual operation of the device under control, is connected to the other input of comparator 39. The output of sensor 50 is supplied to the base electrode of transistor 39b through a gain-controlling circuit formed of series-connected resistors 51 and 52, and a transistor 53 whose collector-emitter circuit is connected in shunt relation with resistor 52. It will be assumed that the control system shown in FIG. 10 is adapted to control the heating of a device and, therefore, sensor 50 is a thermistor whose resistance varies inversely as the temperature of the heated device.

The step-wise control signal produced at output terminal 6b is supplied through an inverting transistor 54 to the base electrode of transistor 53. Thus, depending upon the level of the step-wise control signal, transistor 53 is selectively rendered conductive, so as to provide a low impedance path across resistor 52, or is selectively rendered non-conductive.

Figure 11:
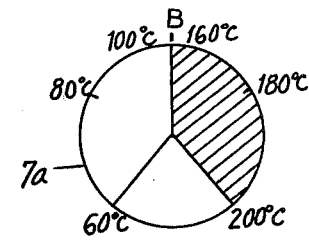
FIG 11 is a simplified diagram of a control knob which can be used to control the operation of the apparatus shown in FIG. 10.

Potentiometer 7 is provided with a control knob 7a which is calibrated over two separate ranges. As shown in FIG. 11, knob 7a is calibrated over a first range from 60° C. to 100° C., and then from 160° C. to 200° C. As shown, the higher operating range is represented by the shaded area, and the demarcation between the lower and higher ranges is designated as point B. Depending upon the nature of the device which is heated, either the lower temperature range or the higher temperature range may be selected therefor.

Let it be assumed that the controlled device is to be heated to a temperature within the lower range represented by the unshaded portion of control knob 7a (FIG. 11). The output tap of potentiometer 7 is suitably positioned, and the voltage produced thereat is supplied to output terminal 6a, and then through inverter 38 to comparator 39. This voltage at the output tap of the potentiometer is less than the voltage at the output of voltage divider resistors 26 and 27. Thus, transistor 21 is conductive to supply transistor 54 with the step-wise control signal of relatively low level. This, in turn, renders transistor 54 non-conductive to supply a relatively high voltage to the base electrode of transistor 53. Thus, transistor 53 likewise is rendered non-conductive. Consequently, resistors 52 and 51 are connected in series with thermistor 50. Accordingly, the voltage across thermistor 50 is a fraction of the operating voltage +B, and may be expressed as: $R_{50}/(R_{50}+R_{51}+R_{52}) \cdot B$, where $R_{50}$, $R_{51}$ and $R_{52}$ are the resistances of thermistor 50, resistor 51 and resistor 52, respectively.

If the temperature selected by the setting of knob 7a is greater than the temperature sensed by thermistor 50, then the voltage supplied to the base electrode of transistor 39a is less than the voltage across thermistor 50. Consequently, transistor 39a is rendered non-conductive, and a relatively high level control voltage is supplied from its collector electrode to the heating apparatus. This increases the heat applied to the control device, and as the temperature thereof increases, the resistance of thermistor 50 decreases so as to correspondingly reduce the voltage supplied to the base electrode of transistor 39b. When the sensed temperature is equal to the desired temperature, transistor 39a is rendered conductive so as to interrupt, or reduce, the operation of the heating apparatus. If the temperature of the control device is greater than the desired temperature, as represented by the reference control signal supplied to transistor 39a, then the voltage across the thermistor is less than this control reference signal. Consequently, transistor 39a is rendered conductive so as to supply a relatively low level control voltage to the heating apparatus. This reduces the amount of heat which is generated, with a concomitant reduction in the temperature of the control device. In this manner, comparator 39 compares the actual temperature of the control device to the desired temperature thereof, and serves to regulate the heating apparatus (not shown) to maintain the actual temperature equal to the desired temperature.

Let it now be assumed that knob 7a is positioned in its higher range, as represented by the shaded portion shown in FIG. 11. When the setting of potentiometer 7 reaches point B (FIG. 11), the voltage applied to the base electrode of transistor 20 exceeds the voltage applied to the base electrode of transistor 21. Consequently, the conductivities of these transistors are reversed, and a positive transition is provided in the step-wise control signal produced at output terminal 6b. The higher voltage level now applied to the base electrode of transistor 54 renders this transistor conductive so as to supply a signal of lower level to transistor 53. Therefore, transistor 53 is rendered conductive so as to provide a low impedance shunt across resistor 52. This increases the gain of the voltage applied to the base electrode of transistor 39b by thermistor 50. That is, when resistor 52 is short-circuited, the voltage across thermistor 50 is expressed as: $R_{50}/(R_{50}+R_{51}) \cdot B$. Thus, even if the resistance $R_{50}$ remains the same, the voltage applied to the base electrode of transistor 39b is abruptly increased when the step-wise control signal undergoes a positive transition.

Assuming that transistor 39a had been conductive just prior to the time that control knob 7a is changed over from a setting in its lower range to a setting in its higher range, the increase in the voltage applied to transistor 39b renders this transistor conductive, and transistor 39a becomes non-conductive. Thus, the control voltage produced at its collector electrode is at a relatively higher level so as to control the heating apparatus to heat the device. The temperature of this device now is controlled as a function of the reference control signal supplied to transistor 39a so as to be equal to the desired temperature as set by the setting of potentiometer 7. It is, of course, appreciated that, when the potentiometer is adjusted to its higher range of settings, the control signal produced at output terminal 6a has the waveform shown in FIG. 3A (or by the broken line shown in FIG. 6A) to the right of the abrupt high-to-low transition therein. By increasing the gain of the sensor voltage supplied to transistor 39b by thermistor 50, the higher range of temperature control is attained. Of course, if knob 7a now is adjusted to a setting in the lower range, represented by the unshaded portion in FIG. 11, the step-wise control signal produced at output terminal 6b undergoes a negative transition, whereby transistor 53 is rendered non-conductive. This reinserts resistor 52 in circuit with resistor 51 and thermistor 50, thereby reducing the gain of the sensor voltage supplied from the thermistor to transistor 39b. Consequently, temperature control over the lower range of temperatures is effected. Nevertheless, regardless of the range of temperature control, it is appreciated that the control signal produced at output terminal 6a varies continuously as a function of the setting of potentiometer 7. The relationship between this control signal and the setting of the potentiometer may be as represented by the waveforms shown in FIGS. 7A, 7C, 7E, 7G and 7I, as discussed above.

While the present invention has been particularly shown and described with reference to some preferred embodiments and applications thereof, it should be readily apparent to those of ordinary skill in the art that various changes and modifications in form and details may be made without departing from the spirit and scope of the invention. Thus, the applications for the control circuits shown in FIGS. 4 and 5 need not be limited solely to control over heating apparatus. This invention can be used with various types of servo systems wherein a common control, such as potentiometer 7, is used to control the operation of either of two devices; or wherein a common control is used to control the operation of a single device over different operable ranges. Furthermore, although the control circuit has been illustrated as comprising a pair of bipolar transistors, it is contemplated that other equivalent transistor devices can be used. Thus, each transistor may be a Darlington-type transistor arrangement, a field effect transistor, or other known transistor devices. Also, potentiometer 7 may comprise any suitable potentiometer-like adjustable resistance. It is intended that the appended claims be interpreted as including the foregoing as well as various other such changes and modifications.

What is claimed is:

1. A control circuit for use with an adjustable resistance to generate a first control signal whose amplitude is a function of the setting of said resistance and to generate a second control signal whose level is changed over from a first level to a second level at a predetermined setting of said resistance, said control circuit comprising a pair of transistor means each having base, emitter and collector electrodes, the emitter electrodes of said pair of transistor means being coupled in common to a reference potential; an adjustable resistance coupled to the collector electrode of one of said pair of transistor means and having an adjustable output tap from which said first control signal is derived; impedance means coupled to the collector electrode of said one of said pair of transistor means; a current source connected in common to said adjustable resistance and to said impedance means such that each of said adjustable resistance and said impedance means is coupled between said collector electrode and said current source; means for connecting said adjustable output tap of said adjustable resistance to the base electrode of said one of said pair of transistor means; means for connecting an output of said impedance means to the base electrode of said other of said pair of transistor means; and means for deriving said second control signal from the collector electrode of said other of said pair of transistor means, such that as the setting of said adjustable output tap changes, the voltage applied to the base electrode of said one of said pair of transistor means, as well as said first control signal, correspondingly changes from a first amplitude toward a second amplitude until said predetermined setting is reached, whereupon the relative conductivities of said pair of transistor means is reversed and said first control signal changes back to said first amplitude.

2. The control circuit of claim 1 further comprising a second current source for coupling said emitter electrodes of said pair of transistor means to said reference potential.

3. The control circuit of claim 1 wherein said impedance means comprises plural resistors connected in series, and said output of said impedance means comprises a junction defined by two of said resistors.

4. The control circuit of claim 3 wherein said adjustable resistance is connected in parallel with said plural series-connected resistors between said collector electrode of said one of said pair of transistor means and said current source.

5. The control circuit of claim 1 further comprising hysteresis means coupled to said one of said pair of transistor means, whereby the conductivities of said pair of transistor means is reversed at a higher setting of said adjustable resistance when said setting is changed in a first direction than when said setting is changed in the opposite direction.

6. The control circuit of claim 5 wherein said hysteresis means comprises a resistor coupled to the collector electrode of said one of said pair of transistor means, said impedance means being connected to one end of said resistor at the junction between said collector electrode and said resistor and said adjustable resistance being connected to the other end of said resistor.

7. Apparatus for selectively controlling either of two devices in accordance with the setting of an adjustable resistance, wherein one device is controlled when the setting of said adjustable resistance is within a first range and the other device is controlled when the setting of said adjustable resistance is within a second, higher range, said apparatus comprising:

first and second sensor means for sensing the actual operation of said one and said other devices, respectively, to produce first and second sense signals representative thereof;

error detecting means for receiving a reference control signal and a sense signal and for producing an error signal in accordance with the difference therebetween, said error signal being adapted to control the operation of said devices;

switch means responsive to a switch control signal for supplying either said first or second sense signal to said error detecting means; and a control circuit coupled to said adjustable resistance for generating said reference control signal whose amplitude is a function of the setting of said resistance and for generating said switch control signal whose level is changed over from a first level to a second level at a predetermined setting of said resistance, said control circuit comprising a pair of transistor means each having base, emitter and collector electrodes, the emitter electrodes of said pair of transistor means being coupled in common to a reference potential; said adjustable resistance being coupled to the collector electrode of one of said pair of transistor means and having an adjustable output tap from which said reference control signal is derived; impedance means coupled to the collector electrode of said one of said pair of transistor means; a current source connected in common to said adjustable resistance and to said impedance means such that each of said adjustable resistance and said impedance means is coupled between said collector electrode and said current source; means for connecting said adjustable output tap of said adjustable resistance to the base electrode of said one of said pair of transistor means; means for connecting an output of said impedance means to the base electrode of said other of said pair of transistor means; and means for deriving said switch control signal from the collector electrode of said other of said pair of transistor means, such that as the setting of said adjustable output tap changes, the voltage applied to the base electrode of said one of said pair of transistor means, as well as said reference control signal, correspondingly changes from a first amplitude toward a second amplitude until said predetermined setting is reached, whereupon the relative conductivities of said pair of transistor means is reversed and said reference control signal changes back to said first amplitude.

8. Apparatus for controlling the operation of a device over first and second operational ranges in accordance with the setting of an adjustable resistance, said apparatus comprising:

sensor means for sensing the actual operation of said device to produce a sense signal representative thereof;

error detecting means for receiving a reference control signal and a sense signal and for producing an error signal in accordance with the difference therebetween, said error signal being adapted to control the operation of said device;

gain selecting means responsive to a selector signal for determining the gain of said sense signal and for supplying said sense signal, with said determined gain, to said error detecting means; and a control circuit coupled to said adjustable resistance for generating said reference control signal whose amplitude is a function of the setting of said resistance and for generating said selector signal whose level is changed over from a first level to a second level at a predetermined setting of said resistance, said control circuit comprising a pair of transistor means each having base, emitter and collector electrodes, the emitter electrodes of said pair of transistor means being coupled in common to a reference potential; said adjustable resistance being coupled to the collector electrode of one of said pair of transistor means and having an adjustable output tap from which said reference control signal is derived; impedance means coupled to the collector electrode of said one of said pair of transistor means; a current source connected in common to said adjustable resistance and to said impedance means such that each of said adjustable resistance and said impedance means is coupled between said collector electrode and said current source; means for connecting said adjustable output tap of said adjustable resistance to the base electrode of said one of said pair of transistor means; means for connecting an output of said impedance means to the base electrode of said other of said pair of transistor means; and means for deriving said selector signal from the collector electrode of said other of said pair of transistor means, such that as the setting of said adjustable output tap changes, the voltage applied to the base electrode of said one of said pair of transistor means, as well as said reference control signal, correspondingly changes from a first amplitude toward a second amplitude until said predetermined setting is reached whereupon the relative conductivities of said pair of transistor means is reversed and said reference control signal changes back to said first amplitude.

9. The apparatus of claim 7 or 8 wherein said control circuit further includes plural resistors connected in series with the collector-emitter circuit of said one of said pair of transistor means, said impedance means being connected to the junction between the collector electrode of said one of said pair of transistor means and said plural resistors, and said adjustable resistance being connected to the junction between two of said plural resistors.

* * * * *